United States Patent [19]

Hidaka

[11] Patent Number: 4,922,459

[45] Date of Patent: May 1, 1990

[54] DYNAMIC SEMICONDUCTOR MEMORY DEVICE

[75] Inventor: Hideto Hidaka, Hyogo, Japan

[73] Assignee: Mitsubishi Denki Kabushiki Kaisha, Tokyo, Japan

[21] Appl. No.: 236,361

[22] Filed: Aug. 25, 1988

[30] Foreign Application Priority Data

Aug. 28, 1987 [JP] Japan ................................ 62-215915

[51] Int. Cl.$^5$ ............................................. G11C 11/34
[52] U.S. Cl. ...................................... 365/206; 365/63
[58] Field of Search .................... 365/51, 63, 206, 207, 365/208, 210

[56] References Cited

U.S. PATENT DOCUMENTS 3,942,164  3/1976  Dunn ..................................... 365/63

FOREIGN PATENT DOCUMENTS 254489  12/1985  Japan .
51096   3/1987  Japan .

OTHER PUBLICATIONS

IEEE Int'l. Sol. St. Conference: "A 553K-Transistor LISP Processor Chip", by P. Bosshart et al., Thurs., Feb. 26, 1987, pp. 202, 203 and 402.

Primary Examiner—Joseph A. Popek
Attorney, Agent, or Firm—Lowe, Price, LeBlanc, Becker & Shur

[57] ABSTRACT

A group of alternate bit line pairs out of a plurality of bit line pairs has an intersecting portion at a second equally divided point out of three equally divided points obtained by dividing the bit line pair into four equal divisions in the longitudinal direction. Another group of alternate bit line pairs out of the plurality of bit line pairs has intersecting portions at first and third equally divided points out of three equally divided points obtained by dividing the bit line pair into four equal divisions in the longitudinal direction. Between the paired bit lines in each of the bit line pairs, one or the other of paired bit lines in another bit line pair is arranged.

8 Claims, 9 Drawing Sheets

DYNAMIC SEMICONDUCTOR MEMORY DEVICE

BACKGROUND OF THE INVENTION

1. Field of the Invention

The present invention relates generally to dynamic semiconductor memory devices, and more particularly, to a semiconductor memory device in which a read error is reduced.

2. Description of the Prior Art

FIG. 1 is a diagram showing a structure of a main portion of a conventional dynamic random access memory (referred to as DRAM hereinafter).

In FIG. 1, a plurality of pairs of bit lines BL and $\overline{BL}$ are arranged intersecting with a plurality of word lines WL. Memory cells MC are connected to intersections of the bit lines BL or $\overline{BL}$ and the word lines WL, respectively. Each of the memory cells MC comprises a transfer gate TG formed of an N channel MOS transistor and a capacitance Cs storing information of an "H" or "L" level. In addition, dummy word lines DWL0 and DWL1 are arranged intersecting with the bit line pairs BL and $\overline{BL}$. A dummy cell DC0 is provided at an intersection of the dummy word line DWL0 and each of the bit lines BL, and a dummy cell DC1 is provided at an intersection of the dummy word line DWL1 and each of the bit lines $\overline{BL}$. An intermediate potential $V_{CC}/2$ between a power-supply potential $V_{CC}$ and a ground potential is stored in the dummy cells DC0 and DC1.

Furthermore, a sense amplifier SA is connected between each of the bit line pairs BL and $\overline{BL}$. The plurality of word lines WL and the dummy word lines DWL0 and DWL1 are connected to a row decoder 101. The bit line pairs BL and $\overline{BL}$ are connected to data input/output lines I/O and $\overline{I/O}$ through transfer gates Q1 and Q2 each formed of an N channel MOS transistor. The transfer gates Q1 and Q2 have their gates connected to a column decoder 102.

At the time of reading out data, a single word line WL is selected by the row recorder 101, so that a potential thereon is raised to the "H" level. Consequently, data stored in the memory cells MC connected to the word line WL are read out onto the corresponding bit lines BL or $\overline{BL}$, respectively. For example, when data are read out onto the bit lines BL, a potential on the dummy word line DWL1 is raised to the "H" level, so that potentials in the dummy cells DC1 are read out onto the corresponding bit lines $\overline{BL}$, respectively. Consequently, potentials on the bit lines $\overline{BL}$ become a reference potential. On the other hand, potentials on the bit lines BL are slightly higher or lower than the reference potential. Thereafter, the potential difference between each of the bit line pairs BL and $\overline{BL}$ is amplified by the corresponding sense amplifier SA. Either one pair of the transfer gates Q1 and Q2 is turned on by the column decoder 102, so that data on the bit line pair BL and $\overline{BL}$ connected thereto is read out onto the data input/output lines I/O and $\overline{I/O}$.

Let's consider a potential which appears on each of the bit line pairs BL and $\overline{BL}$ at the time of reading out data.

As shown in FIG. 2, it is assumed that a capacitance $C_1$ exists between each of the bit lines and the ground potential (fixed potential) through a cell plate or a substrate, a capacitance $C_2$ exists between the paired bit lines, and a capacitance $C_3$ exists between adjacent bit line pairs. In addition, it is assumed that a cell capacitance of the memory cell MC is represented by $C_S$. Each of the bit lines is assumed to have a length l.

When data of the "H" level is stored in a memory cell by writing $V_{CC}$, charges stored in the memory cell become $C_S V_{CC}$. On the other hand, when data of the "L" level is stored in the memory cell by writing 0V, charges stored in the memory cell become zero. In addition, charges of $C_S V_{CC}/2$ (writing of $V_{CC}/2$ or the like) are stored in the dummy cells DC0 and DC1, respectively. It is assumed that the bit line pair is precharged to a power-supply potential $V_{CC}$ before a reading operation.

Let's consider a case in which a memory cell connected to a bit line BL1 is selected and a dummy cell is connected to a bit line $\overline{BL1}$. In this case, a potential $V_{BL1}$ on the bit line BL1 and a potential $V_{\overline{BL1}}$ on the bit line $\overline{BL1}$ become as follows: When the data of the "L" level is read out from the selected memory cell, the potential $V_{BL1}$ on the bit line BL1 is represented by the following equation;

$$V_{BL1} = V_{CC} - \frac{C_S \cdot V_{CC}}{C_1 + C_2 + C_3} + \frac{C_3}{C_1 + C_2 + C_3} \Delta V_{\overline{BL0}} + \frac{C_2}{C_1 + C_2 + C_3} \Delta V_{\overline{BL1}} \quad (1)$$

When the data of the "H" level is read out from the selected memory cell, the potential $\Delta V_{BL1}$ on the bit line BL1 is represented by the following equation;

$$V_{BL1} = V_{CC} + \frac{C_3}{C_1 + C_2 + C_3} \Delta V_{BL0} + \frac{C_2}{C_1 + C_2 + C_3} \Delta V_{\overline{BL1}} \quad (2)$$

In addition, the potential $V_{\overline{BL1}}$ on the bit line $\overline{BL1}$ is represented by the following equation;

$$V_{\overline{BL1}} = V_{CC} - \frac{\frac{1}{2} C_S V_{CC}}{C_1 + C_2 + C_3} + \frac{C_2}{C_1 + C_2 + C_3} \Delta V_{\overline{BL1}} + \frac{C_3}{C_1 + C_2 + C_3} \Delta V_{BL2} \quad (3)$$

where $\Delta V_{\overline{BL0}}$, $\Delta V_{BL1}$, $\Delta V_{BL1}$ and $\Delta V_{BL2}$ indicate the changes in potentials on the bit lines represented by subscripts, respectively.

Considering that the precharge levels of the bit lines BL1 and $\overline{BL1}$ are equal, the potential difference between the paired bit lines is represented by the following equation from calculation of the equations (1) to (3):

$$V_{BL1} - V_{\overline{BL1}} = \Delta V_{BL1} - \Delta V_{\overline{BL1}} \quad (4)$$

$$= \pm \frac{1}{1+\alpha} \cdot \frac{\beta}{2} + \frac{\gamma}{1+\alpha} \cdot (\Delta V_{\overline{BL0}} - \Delta V_{BL2})$$

where $$\alpha = \frac{C_2}{C_1 + C_2 + C_3}, \beta = \frac{C_S \cdot V_{CC}}{C_1 + C_2 + C_3},$$

-continued
$$\gamma = \frac{C_3}{C_1 + C_2 + C_3}$$

In the equation (4), "+" in a double sign "±" indicates the case of reading out data of the "H" level, and "−" in the double sign "±" indicates the case of reading out data of the "L" level. A first term of a right-hand side of the equation (4) indicates a substantial read voltage difference, and a second term thereof indicates noise components applied from a bit line $\overline{BL0}$ in a bit line pair adjacent to the bit line pair BL1 and $\overline{BL1}$ and a bit line BL2 in separate bit line pair adjacent thereto through a coupling capacitance.

Meanwhile, when a pitch between bit lines is decreased as integration density of the memory cell is increased, the capacitance $C_3$ between the adjacent bit line pairs is increased, so that the second term of the equation (4) becomes larger. Consequently, a read voltage is damaged. As a result, a read margin is decreased and a soft error rate is deteriorated. As a result, a malfunction occurs.

In order to solve the above described problems, the inventors of the present invention have proposed a semiconductor memory device in which the decrease in amplitude of the read voltage due to noises which are caused between the adjacent bit line pairs by the capacitance between bit lines can be completely made zero.

In this semiconductor memory device, one or a plurality of intersecting portions are provided on bit line pairs, so that noises of capacitive coupling which the paired bit lines respectively receive from bit line pairs adjacent thereto are the same, whereby the read voltage difference is not decreased.

Referring now to FIG. 3, description is made on a structure of the proposed semiconductor memory device.

As shown in FIG. 3, each of the bit line pairs BL0 and $\overline{BL0}$, BL1 and $\overline{BL1}$, ... is equally divided into areas a, b, c and d each having a length of 1/4, respective bit lines in the bit line pairs intersecting with each other at equally divided points CP1, CP2 and CP3:

(1) The bit lines BL0 and $\overline{BL0}$ intersect with each other at the equally divided point CP2.
(2) The bit lines BL1 and $\overline{BL1}$ intersect with each other at the equally divided points CP1 and CP3.
(1)' The bit lines BL2 and $\overline{BL2}$ intersect with each other at the equally divided point CP2.
(2)' The bit lines BL3 and $\overline{BL3}$ intersect with each other at the equally divided points CP1 and CP3.

More specifically, the bit lines in the bit line pairs in odd numbers counting from the bit line pair BL0 and $\overline{BL0}$ intersect with each other at the equally divided point C2, while the bit lines in the bit line pairs in even numbers intersect with each other at the equally divided points CP1 and CP3. Consequently, noises of capacitive coupling which each of the bit lines receives from the adjacent bit lines are as follows, considered in the same manner as the conventional example shown in FIG. 2:

(1) Noises $\Delta V_{BL1'}$ and $\Delta V_{\overline{BL1'}}$ which the bit lines BL1 and $\overline{BL1}$ respectively receive from the adjacent bit lines are represented by the following equations, respectively;

$$V_{BL1'} = \frac{1}{4} \cdot \frac{\gamma}{1+\alpha} (\Delta V_{BL0} + \Delta V_{BL2} + \Delta V_{\overline{BL2}} + \Delta V_{\overline{BL0}})$$

$$V_{\overline{BL1'}} = \frac{1}{4} \cdot \frac{\gamma}{1+\alpha} (\Delta V_{BL2} + \Delta V_{\overline{BL0}} + \Delta V_{BL0} + \Delta V_{\overline{BL2}})$$

The bit line BL1 receives a noise $\Delta V_{\overline{BL0}}$ in the area a, a noise $\Delta V_{BL2}$ in the area b, a noise $\Delta V_{\overline{BL2}}$ in the area c and a noise $\Delta V_{BL0}$ in the area d. In addition, the bit line $\overline{BL1}$ receives a noise $\Delta V_{BL2}$ in the area a, a noise $\Delta V_{\overline{BL0}}$ in the area b, a noise $\Delta V_{BL0}$ in the area c and a noise $\Delta V_{\overline{BL2}}$ in the area d. Thus, the noises $\Delta V_{BL1'}$ and $\Delta V_{\overline{BL1'}}$ of capacitive coupling are the same.

(2) Noises $\Delta V_{BL2'}$ and $\Delta V_{\overline{BL2'}}$ of capacitive coupling which the bit lines BL2 and $\overline{BL2}$ respectively receive from the adjacent bit lines are represented by the following equations, respectively;

$$\Delta V_{BL2'} = \frac{1}{4} \cdot \frac{\gamma}{1+\alpha} (\Delta V_{\overline{BL1}} + \Delta V_{BL1} + \Delta V_{\overline{BL3}} + \Delta V_{BL3})$$

$$\Delta V_{\overline{BL2'}} = \frac{1}{4} \cdot \frac{\gamma}{1+\alpha} (\Delta V_{BL3} + \Delta V_{\overline{BL3}} + \Delta V_{BL1} + \Delta V_{\overline{BL1}})$$

The bit line BL2 receives a noise $\Delta V_{\overline{BL1}}$ in the area a, a noise $\Delta V_{BL1}$ in the area b, a noise $\Delta V_{\overline{BL3}}$ in the area c and a noise $\Delta V_{\overline{BL3}}$ in the area d. The bit line $\overline{BL2}$ receives a noise $\Delta V_{BL3}$ in the area a, a noise $\Delta V_{\overline{BL3}}$ in the area b, a noise $\Delta V_{\overline{BL1}}$ in the area c and a noise $\Delta V_{\overline{BL1}}$ in the area d. Thus, the noises $\Delta V_{BL2'}$ and $\Delta V_{\overline{BL2'}}$ of capacitive coupling are the same.

In the same manner, noises of capacitive coupling which paired bit lines respectively receive from the adjacent bit lines with respect to all of the bit line pairs are the same.

(3) Noises $\Delta V_{BL0'}$ and $\Delta V_{\overline{BL0'}}$ of capacitive coupling with respect to the bit lines BL0 and $\overline{BL0}$ in an end of a memory array are represented by the following equations, respectively;

$$\Delta V_{BL0'} = \frac{1}{4} \cdot \frac{\gamma}{1+\alpha} (\Delta V_{\overline{BL1}} + \Delta V_{BL1})$$

$$\Delta V_{\overline{BL0'}} = \frac{1}{4} \cdot \frac{\gamma}{1+\alpha} (\Delta V_{BL1} + \Delta V_{\overline{BL1}})$$

The bit line BL0 receives a noise $\Delta V_{\overline{BL1}}$ in the area c, and a noise $\Delta V_{BL1}$ in the area d. The bit line $\overline{BL0}$ receives a noise $\Delta V_{BL1}$ in the area a and a noise $\Delta V_{\overline{BL1}}$ in the area b. Thus, the noises $\Delta V_{BL0'}$ and $\Delta V_{\overline{BL0'}}$ of capacitive coupling are the same.

As described in the foregoing, in the semiconductor memory device shown in FIG. 3, noises of capacitive coupling which the paired bit lines respectively receive from adjacent bit lines at the time of reading out signals from the memory cells are the same. Therefore, the decrease in the read voltage difference caused by the noises of capacitive coupling can be completely prevented, so that a read margin can be increased and a soft error rate can be improved.

FIG. 4 is a diagram showing another example of the proposed semiconductor memory device. The semiconductor memory device shown in FIG. 4 is the same as the semiconductor memory device shown in FIG. 3 except that intersecting portions are further added at a point CP4 in ends of bit lines in bit line pairs BL0 and $\overline{BL0}$, BL2 and $\overline{BL2}$, ... in odd numbers.

In the semiconductor memory devices, it is impossible to lay out each of the intersecting portions provided at the equally divided points CP1, CP2 and CP3 in a completely symmetrical shape with respect to the bit line pair. In the case of the semiconductor memory device shown in FIG. 3, there are two intersecting portions with respect to the bit line pairs BL1 and $\overline{BL1}$, BL3 and $\overline{BL3}$, ... in even numbers, respectively, so that a balanced layout becomes possible as the entire bit line pair. For example, assuming that a bit line is an aluminum layer and an interconnection layer which can intersect with the bit line is a polysilicon (polycristaline silicon) layer, it is necessary that the bit lines BL1 and $\overline{BL1}$ are formed of aluminum and polysilicon, respectively, in the intersecting portions at the equally divided point CP1 while being formed of polisilicon and aluminum, respectively, in the intersecting portions at the equally divided point CP3. Therefore, imbalance of parasitic capacitances of the bit line pair can be avoided. In the semiconductor memory device shown in FIG. 4, a dummy intersecting portions are added at the point CP4 such that capacitances are balanced with respect to the bit line pairs in odd numbers based on the similar effect. Therefore, a state in which capacitances are balanced with respect to all the bit lines can be achieved.

Although in the semiconductor memory devices shown in FIGS. 3 and 4, description is made on a case in which each of the bit line pairs is divided into four areas and the respective paired bit lines intersect with each other in suitable position or positions, the number of segments may be integral multiples of 4, to obtain the same effect. FIG. 5 shows an example of the 8 segments. In the example shown in FIG. 5, the shape shown in FIG. 3 is repeated two times. In the example shown in FIG. 5, it is obvious that the same effect as that shown in FIG. 3 is obtained.

However, the semiconductor memory devices shown in FIGS. 3 to 5 present the following problems. In the semiconductor memory devices shown in FIGS. 3 to 5, noises of capacitive coupling between different bit line pairs are cancelled while noises of capacitive coupling between the paired bit lines remain. For example, when signal charges are read out to the bit line BL0 so that a potential on the bit line BL0 changes, a potential on the bit line $\overline{BL0}$ changes in the same direction as the potential on the bit line BL0. Consequently, the potential difference (signal potential difference) between the paired bit lines BL0 and $\overline{BL0}$ becomes small. Such a noise component is almost the same as the noises of capacitive coupling between different bit line pairs, so that a margin for a reading operation is decreased.

Therefore, in the semiconductor memory devices shown in FIGS. 3 to 5, the noises of capacitive coupling between the different bit line pairs are cancelled while noise of capacitive coupling between the paired bit lines remain, so that read signal voltage characteristics are degraded, whereby a margin for a reading operation is decreased.

Japanese Patent Laying-Open Gazette No. 254489/1985 discloses that every other bit line out of a plurality of bit line pairs is twisted in the central portion thereof, so that array noises are eliminated. In addition, Japanese Patent Laying-Open Gazette No. 51096/1987 discloses that bit line pairs intersecting with each other at odd points and bit line pairs intersecting with each other at even points are alternately arranged, so that array noises are eliminated. Furthermore, THPM 16.5 "A 553K-Transistor LISP Processor Chip", 1987 IEEE International Solid-State Circuits Conference, DIGEST OF TECHNICAL PAPERS, pp. 202-203 discloses that bit line pairs in an SRAM cross each other in the center so that noises applied from other interconnections are cancelled.

However, any of the above described means fails to eliminate noises of capacitive coupling between the paired bit lines, as in the examples shown in FIGS. 3 to 5.

SUMMARY OF THE INVENTION

An object of the present invention is to provide a semiconductor memory device in which a soft error rate is low and there occur few malfunctions.

Another object of the present invention is to provide a dynamic semiconductor memory device in which a large read voltage can be obtained so that a margin for a reading operation is improved.

Still another object of the present invention is to provide a dynamic semiconductor memory device in which noises of capacitive coupling between bit lines can be zero.

A further object of the present invention is to provide a dynamic semiconductor memory device in which noises of capacitive coupling between different bit line pairs can be cancelled and noises of capacitive coupling between paired bit lines can be made zero.

In order to attain the above described objects, the semiconductor memory device according to the present invention comprises a plurality of bit line pairs each comprising paired bit lines, a plurality of word lines arranged intersecting with the plurality of bit lines, a plurality of memory cells located at intersections of the plurality of bit line pairs and the plurality of word lines, respectively, and cancelling means. Each of the plurality of bit line pairs has one or a plurality of intersecting portions in which the paired bit lines intersect with each other. The cancelling means cancels noises of capacitive coupling between the paired bit lines.

In accordance with another aspect of the present invention, the cancelling means is one or the other of separate paired bit lines arranged between the paired two bit lines.

In accordance with still another aspect of the present invention, a group of alternate bit line pairs out of a plurality of bit lines has intersecting portion or portions in which the paired bit lines intersect with each other at equally divided point or points in even numbers out of odd equally divided points obtained by equally dividing the bit line pair into even divisions in the longitudinal direction. In addition, another group of alternate bit line pairs out of the plurality of bit lines has intersecting portion or portions in which the paired bit lines intersect with each other at equally divided portion or portions in odd numbers out of odd equally divided points obtained by dividing the bit line pair into even divisions in the longitudinal direction. Furthermore, between the paired bit lines in each of the plurality of bit line pairs, one or the other of paired bit lines in another bit line pair is arranged.

According to the present invention, since each of the bit line pairs has intersecting portion or portions at suitable point or points, noises of capacitive coupling between the different bit line pairs are cancelled. In addition, since the paired bit lines are not adjacent to each other in a portion other than the intersecting portion or portions, noises of capacitive coupling between the paired bit lines are negligibly reduced.

Thus, according to the present invention, since noises of capacitive coupling between the different bit line pairs are cancelled and noises of capacitive coupling between the paired bit lines become almost zero, degradation of read voltage difference characteristics can be prevented and a margin for a signal reading operation can be significantly improved.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
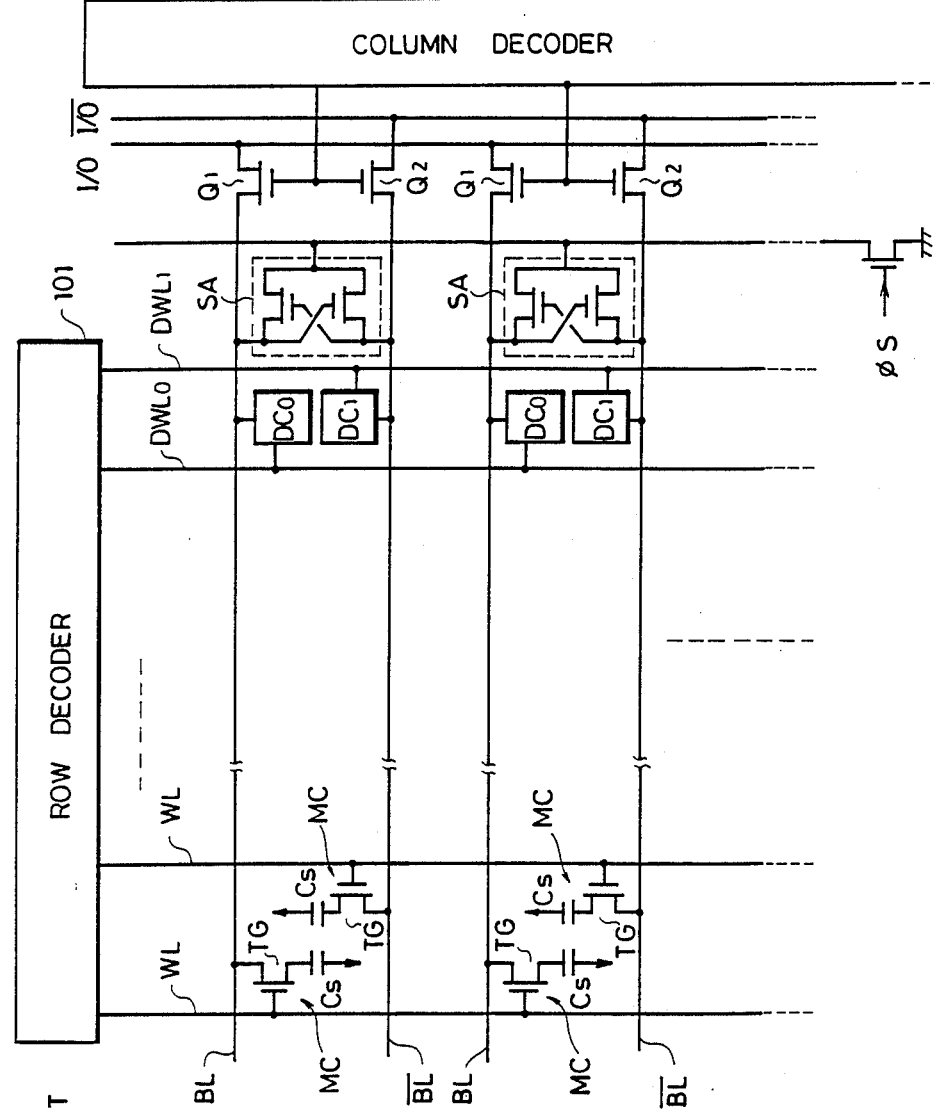
FIG. 1 is a circuit diagram showing a structure of a main portion of a conventional semiconductor memory device.
Figure 2:
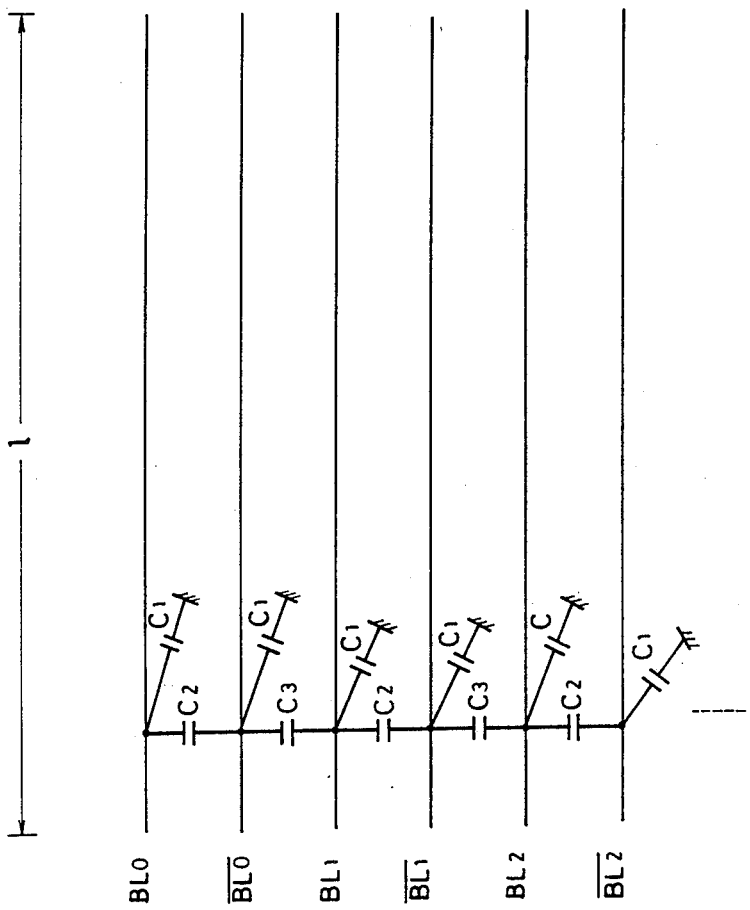
FIG. 2 is a diagram showing capacitances which exist between bit lines in the conventional semiconductor memory device.

Referring now to the drawings, an embodiment of the present invention will be described in detail.

Figure 6:
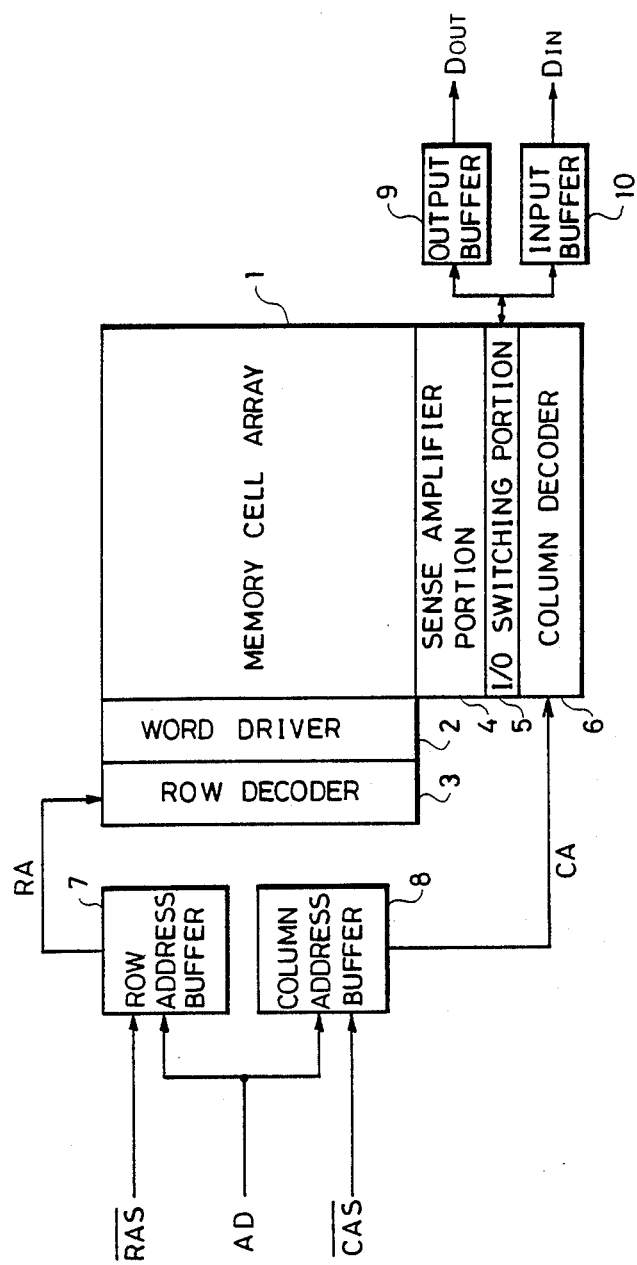
FIG. 6 is a block diagram showing the entire structure of a semiconductor memory device according to an embodiment of the present invention.

Referring now to FIG. 6, description is made on the entire structure of a DRAM according to an embodiment of the present invention.

In FIG. 6, a plurality of word lines and a plurality of bit line pairs are arranged intersecting with each other in a memory cell array 1, memory cells being provided at intersections thereof, respectively. The word lines in the memory cell array 1 are connected to a row decoder 3 through a word driver 2. In addition, the bit line pairs in the memory cell array 1 are connected to a column decoder 6 through a sense amplifier portion 4 and an I/O switching portion 5. A row address buffer 7 and a column address buffer 8 are connected to the row decoder 3 and the column decoder 6, respectively.

At the time of reading out data, the row address buffer 7 is first responsive to a row address strobe signal $\overline{RAS}$ externally applied for applying to the row decoder 3 an address signal AD externally applied as a row address signal RA. The row decoder 3 is responsive to the row address signal RA for selecting one of the plurality of word lines. Consequently, data in the plurality of memory cells connected to the selected word line are read out onto the corresponding bit lines, respectively. The data are sensed and amplified by the sense amplifier portion 4. The column address buffer 8 is then responsive to a column address strobe signal $\overline{CAS}$ externally applied for applying to the column decoder 6 the address signal AD externally applied as an address signal CA. The column decoder 6 is responsive to the column address signal CA for selecting one of data corresponding to one row latched in the sense amplifier portion 4. The selected data is extracted to the exterior as output data $D_{OUT}$ through the I/O switching portion 5 and the output buffer 9.

On the other hand, at the time of writing data, input data $D_{IN}$ is written into the memory cell selected by the row decoder 3 and the column decoder 6 through an input buffer 10 and the I/O switching portion 5.

Figure 7:
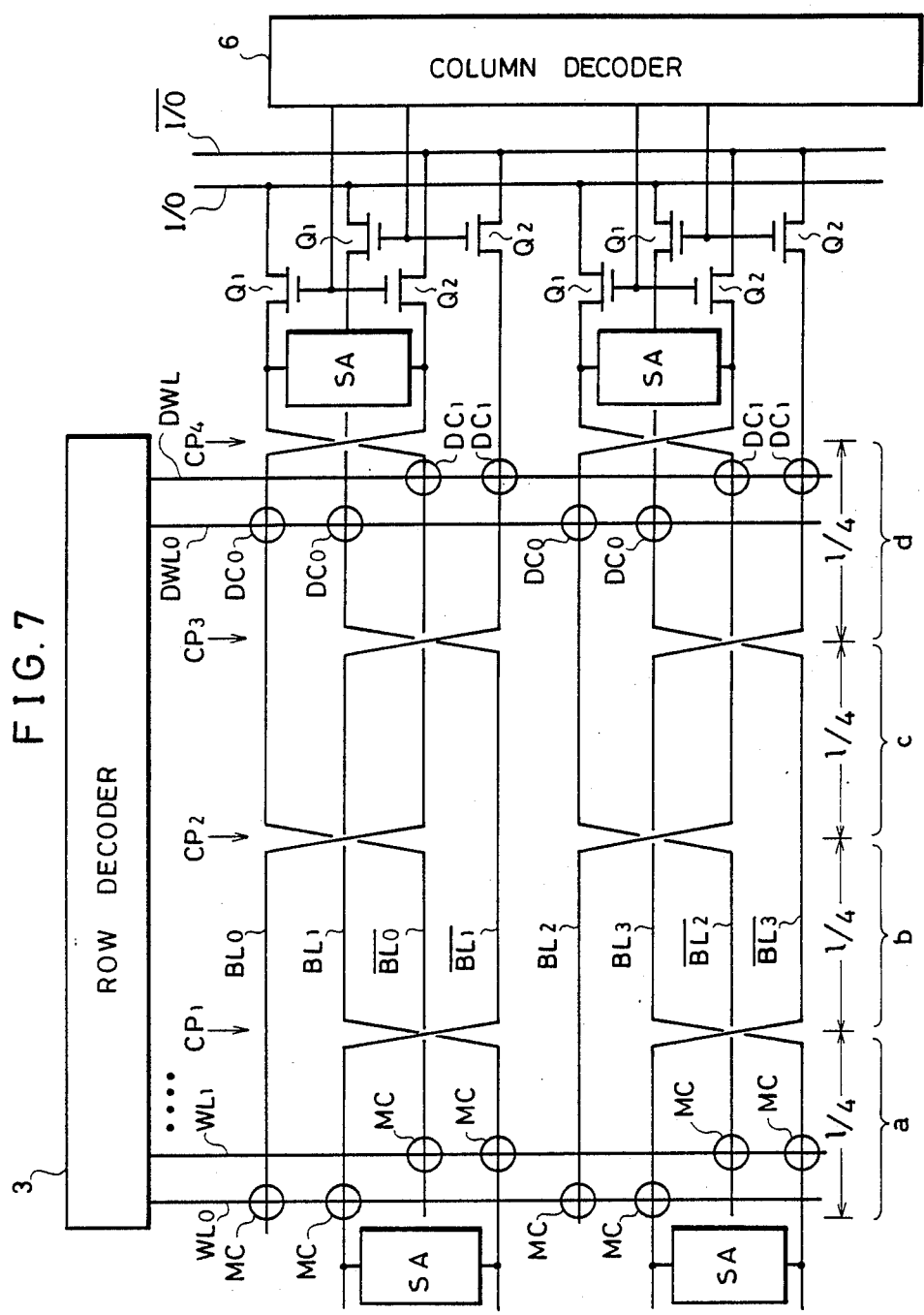
FIG. 7 is a diagram showing a structure of a main portion of the semiconductor memory device shown in FIG. 6.

FIG. 7 is a circuit diagram showing a structure of a main portion of the DRAM shown in FIG. 6.

FIG. 7, four bit line pairs BL0 and $\overline{BL0}$ to BL3 and $\overline{BL3}$ are typically shown. In addition, there are typically shown two word lines WL0 and WL1 intersecting with the bit line pairs BL0 and $\overline{BL0}$ to BL3 and $\overline{BL3}$.

Memory cells MC are provided at intersections of the bit lines $\overline{BL0}$ to $\overline{BL3}$ and the word line WL0, respectively. Memory cells MC are provided at intersections of the bit lines BL0 to BL3 and the word line WL1, respectively. The structure of each of the memory cells MC is the same as that of each of the memory cells MC shown in FIG. 1. In addition, dummy word lines DWL0 and DWL1 are arranged intersecting with the bit line pairs BL0 and $\overline{BL0}$ to BL3 and $\overline{BL3}$. Dummy cells DC0 are provided at intersecting of the dummy work line DWL0 and the bit lines $\overline{BL0}$ to $\overline{BL3}$, respectively. Dummy cells DC1 are provided at intersections of the dummy word line DWL1 and the bit lines $\overline{BL0}$ to $\overline{BL3}$, respectively. An intermediate potential $V_{CC}/2$ between a power-supply potential $V_{CC}$ and a ground potential is stored in the dummy cells DC0 and DC1.

Sense amplifiers SA are connected to the bit line pairs BL0 and $\overline{BL0}$ and B62 and $\overline{BL2}$, respectively, in ends thereof on the right in FIG. 7. Sense amplifiers SA are connected to the bit line pairs BL1 and $\overline{BL1}$ and BL3 and $\overline{BL3}$, respectively, in ends thereof on the left in FIG. 7 The word lines WL0 and WL1 and the dummy word lines DWL0 and DWL1 are connected to a row decoder 3. Each of the bit line pairs BL0 and $\overline{BL0}$ to BL3 and $\overline{BL3}$ is connected to a pair of data input/output lines I/O and $\overline{I/O}$ through transfer gates Q1 and Q2 each comprising an N channel MOS transistor. The transfer gates Q1 and Q2 have their gates connected to a column decoder 6. The plurality of sense amplifiers SA constitute the sense amplifier portion 4 shown in FIG. 6. In addition, the plurality of transfer gates Q1 and Q2 and the pair of data input/output lines I/O and $\overline{I/O}$ constitute the I/O switching portion 5 shown in FIG. 6. Each of the bit lines has a length l.

As shown in FIG. 7, each of the bit line pairs BL0 and $\overline{BL0}$ to BL3 and $\overline{BL3}$ is equally divided into four areas a, b, c and d each having a length l/4, the bit lines intersecting with each other at equally divided points CP1, CP2, and CP3 as follows:

(1) The bit lines BL0 and $\overline{BL0}$ intersect with each other at the equally divided point CP2.

(2) The bit lines BL1 and $\overline{BL1}$ intersect with each other at the equally divided points CP1 and CP3.

(1)' The bit lines BL2 and $\overline{BL2}$ intersect with each other at the equally divided point CP2.

(2)' The bit lines BL3 and $\overline{BL3}$ intersect with each other at the equally divided points CP1 and CP3.

More specifically, the bit lines in the bit line pairs in odd numbers counting from bit line pair BL0 and $\overline{BL0}$ intersect with each other at the equally divided point CP2, while the bit lines in the bit line pairs in even numbers intersect with each other at the equally divided points CP1 and CP3.

Additionally, one or the other of the paired bit lines BL1 and $\overline{BL1}$ is arranged between the paired bit lines BL0 and $\overline{BL0}$. One or the other of the paired bit lines BL3 and $\overline{BL3}$ is arranged between the paired bit lines BL2 and $\overline{BL2}$. In the above described manner, the paired bit lines are prevented from being adjacent to each other. For example, since the bit line BL0 or $\overline{BL0}$ is arranged between the paired bit lines BL1 and $\overline{BL1}$, the bit lines BL1 and $\overline{BL1}$ are not adjacent to each other. Similarly, the bit lines BL0 and $\overline{BL0}$, BL2 and $\overline{BL2}$ and BL3 and $\overline{BL3}$ are not adjacent to each other, respectively.

At the time of reading out data, a single word line is selected by the row decoder 3, so that a potential thereon is raised to an "H" level. Consequently, data in the memory cells MC connected to the word line are read out onto the bit lines. For example, when the data is read out onto the bit line BL1, a potential on the dummy word line DWK1 is raised to the "H" level, so that a potential in the dummy cell DC1 is read out onto the bit line $\overline{BL1}$. Therefore, a potential on the bit line $\overline{BL1}$ becomes a reference potential. On the other hand, a potential on the bit line BL1 is slightly higher or lower than the reference potential. Thereafter, the potential difference between the paired bit lines is amplified by the corresponding sense amplifier SA. Either one of the pairs of transfer gates Q1 and Q2 is turned on by the column decoder 6, so that data on the bit line pair connected thereto is read out onto the pair of data input-/output lines I/O and $\overline{I/O}$.

Figure 3:
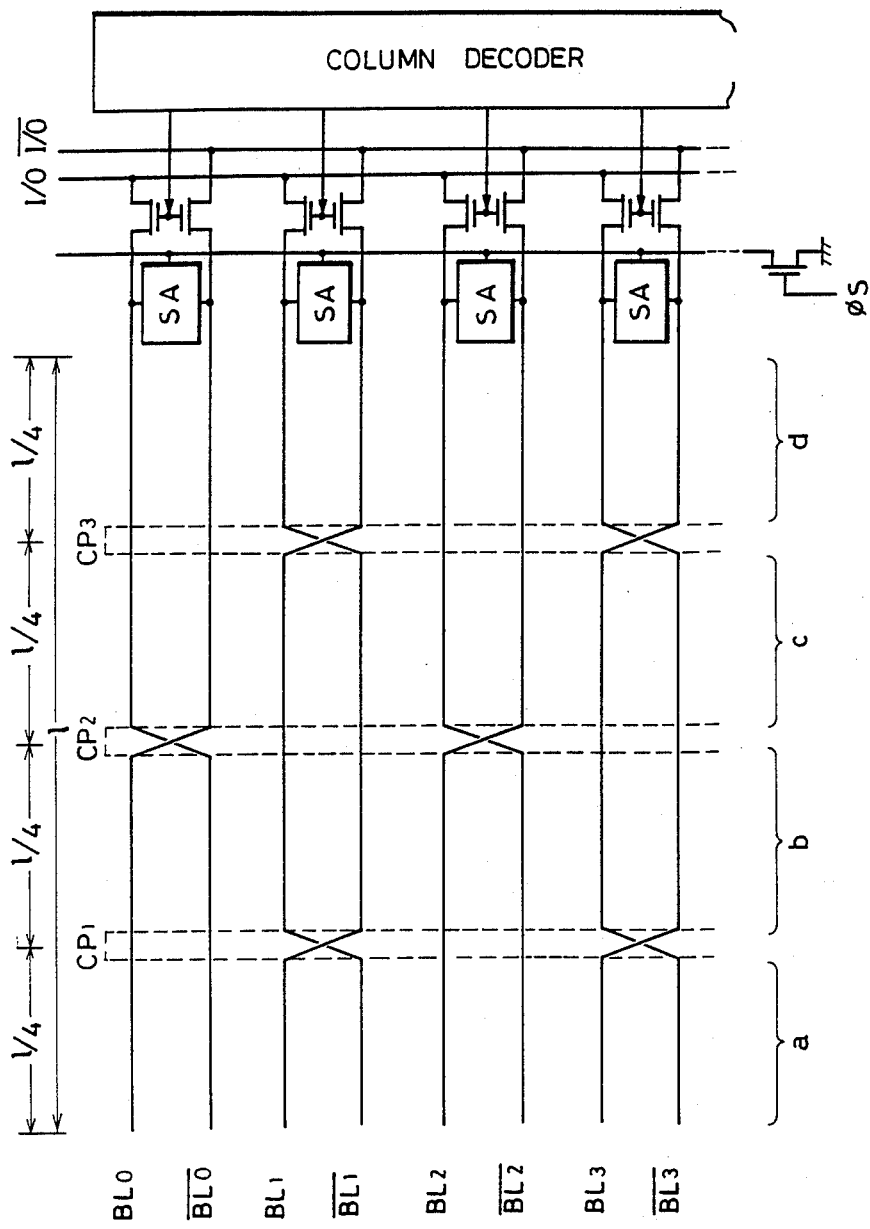
FIG. 3 is a diagram showing a structure of a main portion in an example of a proposed semiconductor memory device.
Figure 4:
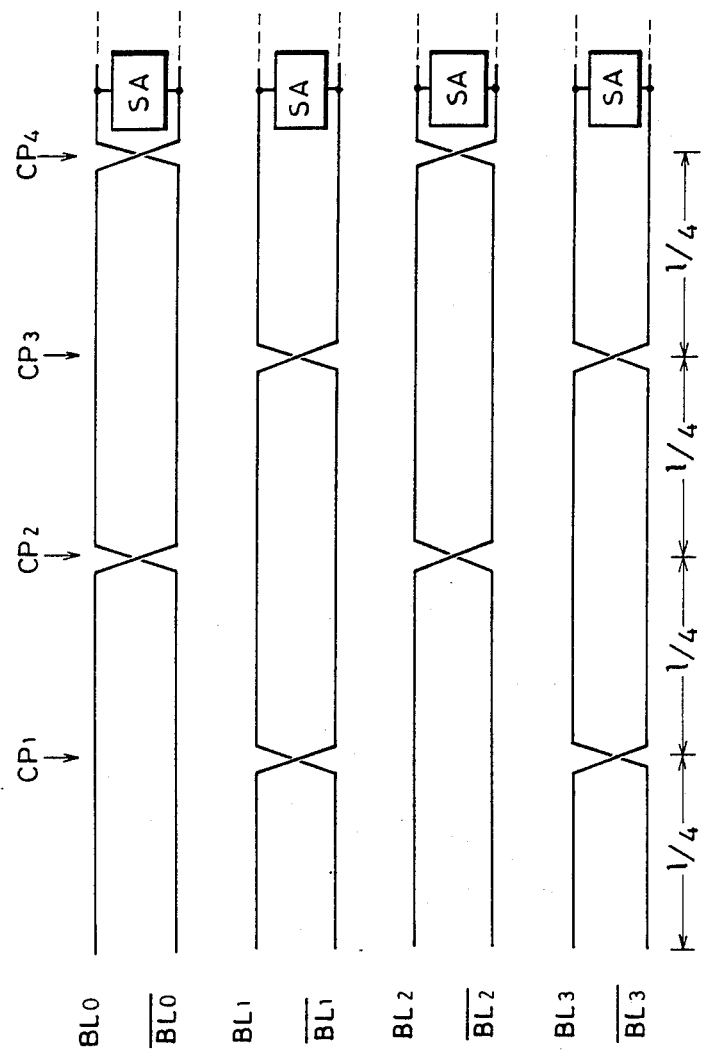
FIG. 4 is a diagram showing a structure of a main portion in another example of the proposed semiconductor memory device.
Figure 5:
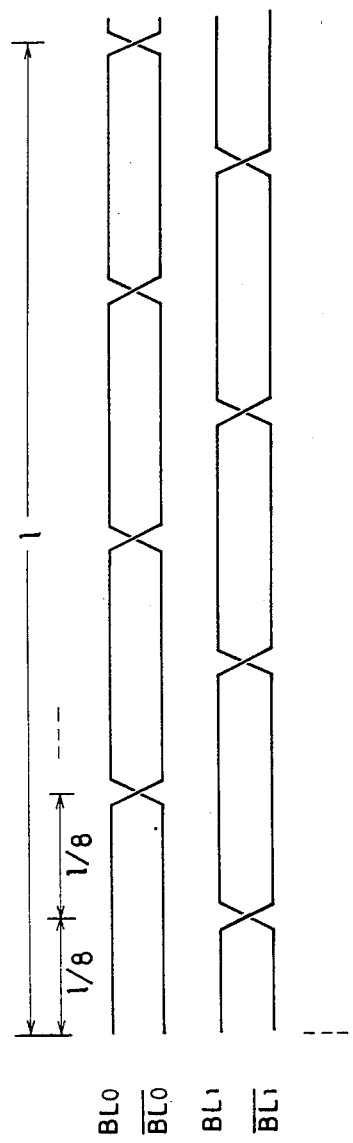
FIG. 5 is a diagram showing a structure of a main portion in still another example of the proposed semiconductor memory device.
Figure 8:
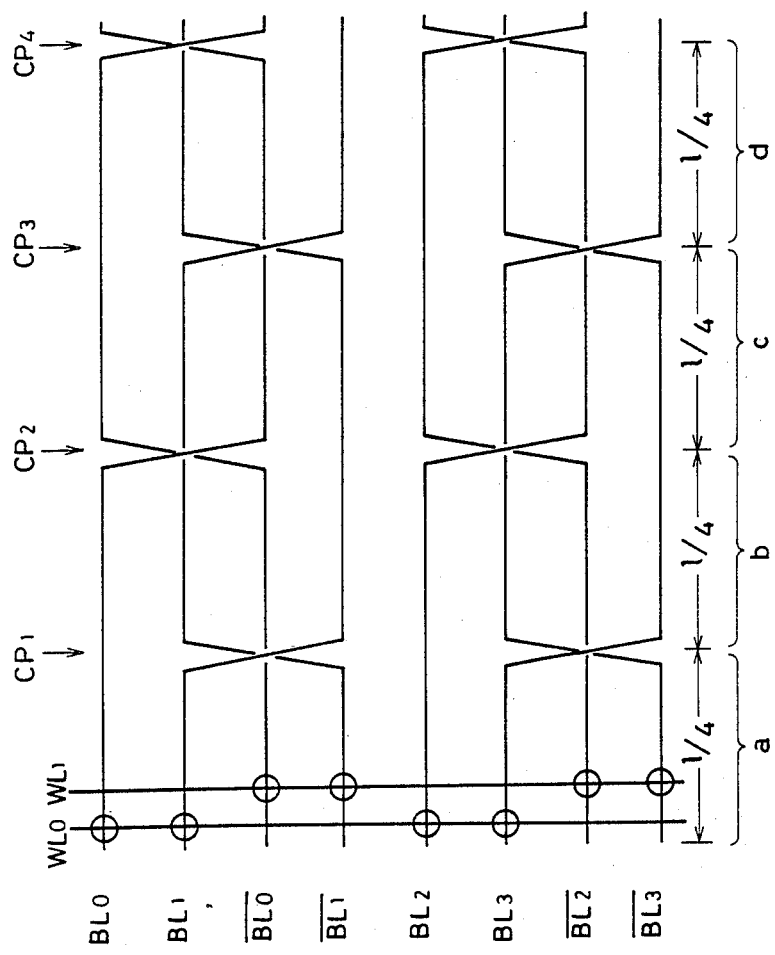
FIG. 8 is a diagram for explaining a bit line potential at the time of a reading operation in a semiconductor memory device according to an embodiment of the present invention.

Referring to FIG. 8, let's consider noise components of capacitive coupling which each of the bit lines receives from adjacent bit lines at the time of reading out signals, as in the above described semiconductor memory devices shown in FIGS. 3 to 5.

(1) Noises $\Delta V_{BL1}$ and $\Delta V_{\overline{BL1}}$ which the bit lines BL1 and $\overline{BL1}$ respectively receive from adjacent bit lines are represented by the following equations, respectively:

$$\Delta V_{BL1} = \frac{1}{4} \cdot \frac{\gamma}{1+\alpha}(\Delta V_{BL0} + \Delta V_{\overline{BL0}} + \Delta V_{\overline{BL0}} + \Delta V_{BL2} +$$

$$\Delta V_{BL0} + \Delta V_{\overline{BL2}} + \Delta V_{BL0} + \Delta V_{\overline{BL0}})$$

$$\Delta V_{\overline{BL1}} = \frac{1}{4} \cdot \frac{\gamma}{1+\alpha}(\Delta V_{\overline{BL0}} + \Delta V_{BL2} + \Delta V_{BL0} + \Delta V_{\overline{BL0}} +$$

$$\Delta V_{BL0} + \Delta V_{\overline{BL0}} + \Delta V_{BL0} + \Delta V_{\overline{BL2}})$$

The bit line BL1 receives noises $\Delta V_{BL0}$ and $\Delta V_{BL0}$ in the area a, noises $\Delta V_{\overline{BL0}}$ and $\Delta V_{BL2}$ in the area b, noises $\Delta V_{\overline{BL0}}$ and $\Delta V_{\overline{BL2}}$ in the area c, and noises $\Delta V_{BL0}$ and $\Delta V_{\overline{BL0}}$ in the area d. The bit line $\overline{BL1}$ receives noises $\Delta V_{\overline{BL0}}$ and $\Delta V_{BL2}$ in the area a, noises $\Delta V_{\overline{BL0}}$ and $\Delta V_{\overline{BL0}}$ in the area b, noises $\Delta V_{BL0}$ and $\Delta V_{\overline{BL0}}$ in the area c, and noises $\Delta V_{BL0}$ and $\Delta V_{\overline{BL2}}$ in the area d. Thus, the noises $\Delta V_{BL1}$ and $\Delta V_{\overline{BL1}}$ of capacitive coupling are the same.

(2) Noises $\Delta V_{BL2}$, $\Delta V_{\overline{BL2}}$ of capacitive coupling which the bit lines BL2 and $\overline{BL2}$ respectively receive from adjacent bit lines are represented by the following equations, respectively:

$$\Delta V_{BL2} = \frac{1}{4} \cdot \frac{\gamma}{1+\alpha}(\Delta V_{\overline{BL1}} + \Delta V_{BL3} + \Delta V_{BL1} + \Delta V_{\overline{BL3}} +$$

$$\Delta V_{BL3} + \Delta V_{\overline{BL3}} + \Delta V_{BL3} + \Delta V_{\overline{BL3}})$$

$$\Delta V_{\overline{BL2}} = \frac{1}{4} \cdot \frac{\gamma}{1+\alpha}(\Delta V_{BL3} + \Delta V_{\overline{BL3}} + \Delta V_{BL3} + \Delta V_{\overline{BL3}} +$$

$$\Delta V_{BL1} + \Delta V_{\overline{BL3}} + \Delta V_{\overline{BL1}} + \Delta V_{BL3})$$

The bit line BL2 receives noises $\Delta V_{\overline{BL1}}$ and $\Delta V_{BL3}$ in the area a, noises $\Delta V_{BL1}$ and $\Delta V_{\overline{BL3}}$ in the area b, noises $\Delta V_{BL3}$ and $\Delta V_{\overline{BL3}}$ in the area c, and noises $\Delta V_{BL3}$ and $\Delta V_{\overline{BL3}}$ in the area d. The bit line $\overline{BL2}$ receives noises $\Delta V_{BL3}$ and $\Delta V_{\overline{BL3}}$ in the area a, noises $\Delta V_{BL3}$ and $\Delta V_{\overline{BL3}}$ in the area b, noises $\Delta V_{BL1}$ and $\Delta V_{\overline{BL3}}$ in the area c, and noises $\Delta V_{\overline{BL1}}$ and $\Delta V_{BL3}$ in the area d. Thus, the noises $\Delta V_{BL2}$ and $\Delta V_{\overline{BL2}}$ of capacitive coupling are the same.

With respect to other bit line pairs, noises of capacitive coupling which the paired bit lines respectively receive from adjacent bit lines are equal to each other, so that noise components are cancelled, similarly to (1) and (2).

Meanwhile, in the semiconductor memory device shown in FIG. 4, a noise component which each of the bit lines in each of the bit line pairs receives from a different bit line pair can be cancelled as described above, while a noise component between the paired bit lines remains. The noise component is a component which eliminates a signal voltage difference by applying a coupling noise to the bit line $\overline{BL0}$ in response to the change in potential on the bit line BL0 which appeared when signal charges are read out to, for example, the bit line BL0. On the other hand, in the present embodiment, the paired bit lines are not adjacent to each other, so that such a noise component is eliminated. Instead, a noise component which each of the paired bit lines receives from a different bit line pair is increased. However, since this noise component is cancelled with respect to each of the bit line pairs as described above, the noise component may be considered zero.

Figure 9:
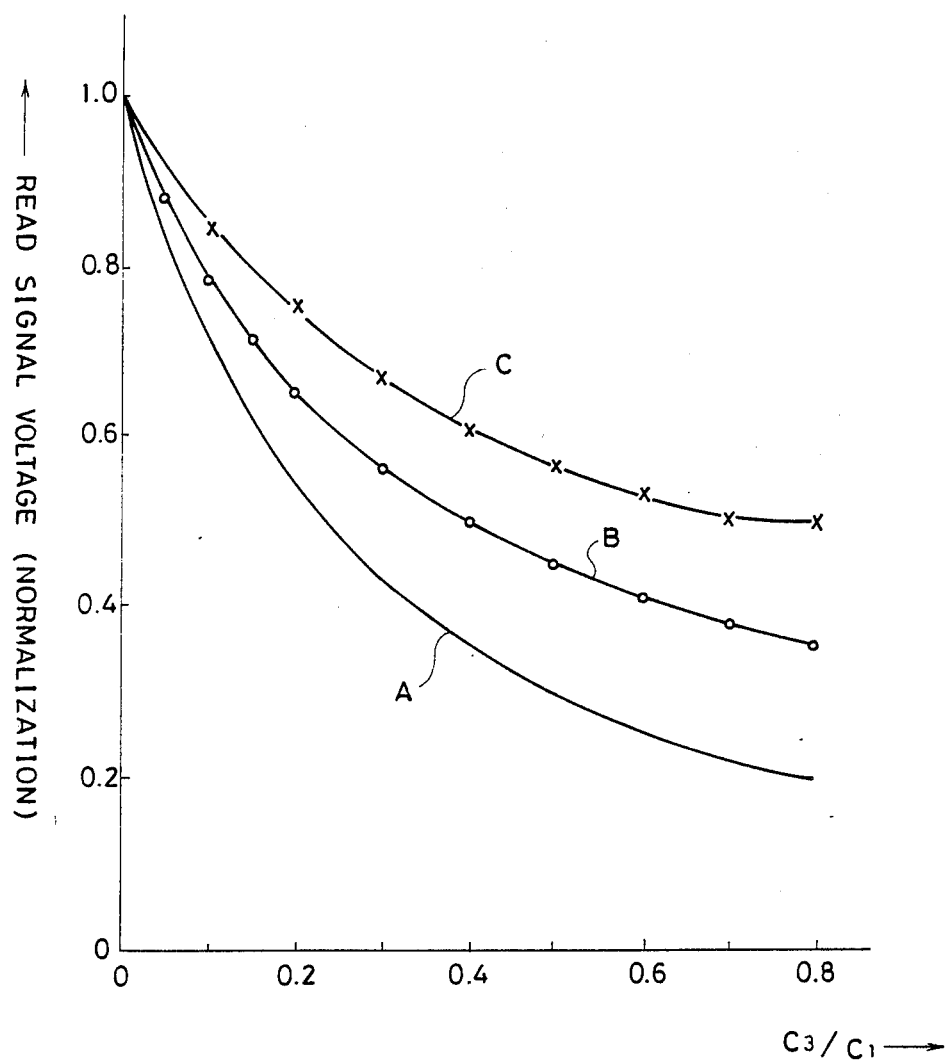
FIG. 9 is a diagram of characteristics for explaining the effect of the present invention.

FIG. 9 shows read signal voltage differences in the semiconductor memory device according to the present embodiment, the semiconductor device shown in FIG. 4 and the conventional semiconductor memory device (with an ordinary folded bit line system) shown in FIG. 1. FIG. 9 shows a read voltage difference in the case of the worst pattern of memory cell data in a computer simulation.

In FIG. 9, A denotes the read voltage difference in the semiconductor memory device with an ordinary folded bit line system shown in FIG. 1. B denotes the read voltage difference in the semiconductor memory device shown in FIG. 4. C denotes the read voltage difference in the semiconductor memory device according to the present embodiment. In the semiconductor memory device according to the present embodiment, degradation of read signal voltage characteristics is clearly improved, as compared with the conventional semiconductor memory device shown in FIG. 1.

The plurality of sense amplifiers SA are arranged as shown in FIG. 7, so that the paired bit lines can be connected to the corresponding sense amplifiers SA, respectively, without particularly replacing the order of the bit lines BL0, BL1, $\overline{BL0}$, $\overline{BL1}$, . . . . In addition, a layout pitch of each of the sense amplifiers SA can be relaxed by two times that of the semiconductor memory device shown in FIG. 1, which is advantageous.

Although in the above described embodiment, each of the bit lines is divided into four areas a, b, c and d, it should be noted that the present invention is not limited to the same. For example, the structure may be obtained by integral multiples of the structure according to the above described embodiment in the direction of the bit lines based on the same effect as that of the semiconductor memory device shown in FIG. 5.

In addition, the intersecting portions in a position of the point CP4 shown in the above described embodiment are provided to maintain a capacitance balance in each of the bit line pairs based on the same effect as that of the semiconductor memory device shown in FIG. 5. However, when the capacitance balance is not a problem, there may be no intersecting portion in the position of the point CP4, as in the semiconductor memory device shown in FIG. 3.

Furthermore, although in the above described embodiment, the dummy cells are employed as means for applying a reference potential at the time of reading out data, it should be noted that the present invention is not limited to the same. For example, the present invention can be also applied to a semiconductor memory device with a system of equalizing potentials on paired bit lines to a ½ $V_{CC}$ level before reading out data.

Additionally, column decoders and pairs of data input/output lines may be provided in both ends of the bit line pairs, respectively, so that a group of alternate bit line pairs out of the plurality of bit line pairs is coupled to one of the column decoders and one of the pairs of data input/output lines through transfer gates and another group of alternate bit line pairs is coupled to the other column decoder and the other pair of data input/output lines through the transfer gates.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
a plurality of paired bit lines,
a plurality of sense amplifiers each coupled to a respective pair of said plurality of paired bit lines for detecting the potential difference between said paired bit lines,
at least one bit line of each of said plurality of paired bit lines having at least one portion intersecting with and overlapping a bit line of an adjacent paired bit line,
a plurality of word lines arranged intersecting with said plurality of paired bit lines,
a plurality of memory cells located at intersections of said plurality of paired bit lines and said plurality of word lines, respectively, and
cancelling means comprising the overlapping bit lines at said at least one portion for cancelling noises of capacitive coupling between said paired bit lines.

2. A semiconductor memory device comprising:
a plurality of bit line pairs each comprising paired bit lines,
each of said plurality of bit line pairs having one or a plurality of intersecting portions in which said paired bit lines intersect with each other,
a plurality of word lines arranged intersecting with said plurality of bit line pairs,
a plurality of memory cells located at intersections of said plurality of bit line pairs and said plurality of word lines, respectively, and
cancelling means for cancelling noises of capacitive coupling between said paired bit lines,
a group of alternate bit line pairs out of said plurality of bit line pairs having said intersecting portion or portions at equally divided point or points in even numbers out of odd equally divided points obtained by equally dividing the bit line pair into even divisions in the longitudinal direction, and
another group of alternate bit line pairs out of said plurality of bit line pairs having said intersecting portion or portions at equally divided point or points in odd numbers out of odd equally divided points obtained by equally dividing the bit line pair into even divisions in the longitudinal direction.

3. The semiconductor memory device according to claim 2, wherein said group of alternate bit line pairs out of said plurality of bit line pairs further has said intersecting portion in one end thereof.

4. A semiconductor memory device comprising:
a plurality of bit line pairs each comprising paired bit lines,
a group of alternate bit line pairs out of said plurality of bit line pairs having intersecting portion or portions in which said paired bit lines intersect with each other at equally divided point or points in even numbers out of odd equally divided points obtained by equally dividing the bit line pair into even numbers in the longitudinal direction,
another group of alternate bit line pairs out of said plurality of bit line pairs having intersecting portion or portions in which said paired bit lines intersect with each other at equally divided point or points in odd numbers out of odd equally divided points obtained by equally dividing the bit line pair into even divisions in the longitudinal direction,
between said paired bit lines in each of said plurality of bit line pairs, one or the other of said paired bit lines in another bit line pair being arranged,
a plurality of word lines arranged intersecting with said plurality of bit line pairs, and
a plurality of memory cells located at intersections of said plurality of bit line pairs and said plurality of word lines, respectively.

5. The semiconductor memory device according to claim 4, which further comprises a plurality of sense amplifiers each provided corresponding to each of said plurality of bit line pairs for detecting the potential difference between said paired bit lines.

6. The semiconductor memory device according to claim 4, which further comprises
a plurality of sense amplifiers each provided in one end of said group of alternate bit line pairs out of said plurality of bit line pairs for detecting the potential difference between said paired bit lines, and
a plurality of sense amplifiers each provided in the other end of said other group of alternate bit line pairs out of said plurality of bit line pairs for detecting the potential difference between said paired bit lines.

7. The semiconductor memory device according to claim 6, wherein said group of alternate bit line pairs out of said plurality of bit line pairs further has an intersecting portion in which said paired bit lines intersect with each other in one end thereof.

8. The semiconductor memory device according to claim 4, wherein said group of alternate bit line pairs out of said plurality of bit line pairs further has an intersecting portion in which said paired bit lines intersect with each other in one end thereof.

* * * * *